(12) United States Patent
Chang et al.

(10) Patent No.: US 6,867,099 B2
(45) Date of Patent: Mar. 15, 2005

(54) SPILT-GATE FLASH MEMORY STRUCTURE AND METHOD OF MANUFACTURE

(75) Inventors: Ko-Hsing Chang, Hsinchu (TW); Cheng-Yuan Hsu, Hsinchu (TW)

(73) Assignee: Powerchip Semiconductor Corp., Hsinchu (TW)

(*) Notice: Subject to any disclaimer, the term of this patent is extended or adjusted under 35 U.S.C. 154(b) by 0 days.

(21) Appl. No.: 10/710,784

(22) Filed: Aug. 3, 2004

(65) Prior Publication Data

US 2004/0259310 A1 Dec. 23, 2004

Related U.S. Application Data

(62) Division of application No. 10/064,883, filed on Aug. 27, 2002, now Pat. No. 6,794,710.

(51) Int. Cl.$^7$ ............................................. H01L 21/336
(52) U.S. Cl. ......................................................... 438/259
(58) Field of Search ........................ 438/259, FOR 202, 438/FOR 203; 257/314–320, E21.179, E21.422, E21.68, E21.688

(56) References Cited

U.S. PATENT DOCUMENTS

| | | | | |
|---|---|---|---|---|
| 5,392,237 A | * | 2/1995 | Iida | 365/185.16 |
| 5,429,970 A | * | 7/1995 | Hong | 438/259 |
| 5,773,343 A | * | 6/1998 | Lee et al. | 438/259 |
| 6,391,719 B1 | * | 5/2002 | Lin et al. | 438/259 |

* cited by examiner

*Primary Examiner*—Oiik Chaudhuri
*Assistant Examiner*—Brook Kebede
(74) *Attorney, Agent, or Firm*—Jiang Chyun IP Office

(57) ABSTRACT

A split-gate flash memory structure. The flash memory at least includes a substrate having a trench therein, a floating gate, a select gate and a source/drain region. The floating gate is formed inside the trench such that the upper surface of the floating gate is below the substrate surface. The select gate is also formed inside the trench above the floating gate such that the select gate protrudes beyond the substrate surface. The source/drain region is formed in the substrate on each side of the select gate. The source/drain region and the floating gate are separated from each other by a distance. A tunnel oxide layer separates the floating gate from the substrate and a gate dielectric layer separates the floating gate from the select gate. A dielectric layer separates the select gate from the substrate.

9 Claims, 11 Drawing Sheets

SPILT-GATE FLASH MEMORY STRUCTURE AND METHOD OF MANUFACTURE

CROSS REFERENCE TO RELATED APPLICATIONS

This application is a divisional of a prior application Ser. No. 10/064,883, filed Aug. 27, 2002, now U.S. Pat. No. 6,794,710.

BACKGROUND OF INVENTION

1. Field of Invention

The present invention relates to a method of manufacturing flash memory. More particularly, the present invention relates to a split-gate flash memory structure and a corresponding manufacturing method.

2. Description of Related Art

Flash memory is a type of memory that permits multiple read/write and erase operations. Since stored data is preserved even if power to the device is cut off, flash memory is widely used as a non-volatile memory device in personal computers and electronic equipment.

A typical flash memory unit has doped polysilicon layers to function as floating gate and control gate and a substrate. The floating gate and the control gate are separated from each other by a dielectric layer. Meanwhile, the floating gate and the substrate are separated from each other by a tunnel oxide layer. To write/erase data, a bias voltage is applied to the control gate and the source/drain region so that electrons are injected into the floating gate or the electrons are pulled out from the floating gate. To read data off the flash memory, an operating voltage is applied to the control gate so that the charge-up state of the floating gate will affect the on/off state of the underlying channel. The on/off status of the channel determines the read-out to be a logic level '1' or '0'.

To erase data from the flash memory, the substrate, the drain (source) terminal or the control gate is at a relatively high potential. Tunneling effect is utilized so that electrons penetrate through a tunnel oxide layer to the substrate or drain (source) terminal (that is, the substrate erase or drain (source) side erase) or pass through the dielectric layer into the control gate. However, in erasing data inside the flash memory, the quantity of electrons bled out of the floating gate during a flash memory erasing operation is difficult to control. Ultimately, too many electrons may bleed out from the floating gate leading to a state often referred to as over-erasure. Severe over-erasure may result in a conductive channel forming underneath the floating gate even without the application of an operating voltage and hence lead to erroneous readout data. To reduce the over-erase problem, most flash memory deploys a split-gate design. A major aspect of a split-gate flash memory is that, aside from the portion over the floating gate, a portion of the control gate is lying over the substrate with a gate dielectric layer formed between the two layers. With this arrangement, a conductive channel is prevented from forming underneath the control gate so that the source/drain regions remain nonconductive and data read-out errors are minimized. However, the each split-gate unit occupies a memory cell area larger than a conventional erasable programmable read-only-memory with tunnel oxide (ETOX). Hence, the flash memory has an overall level of integration slightly below other types of memory design.

SUMMARY OF INVENTION

Accordingly, one object of the present invention is to provide a split-gate flash memory having a floating gate and a select gate fabricated on a trench in a substrate so that size of each memory cell is reduced.

To achieve these and other advantages and in accordance with the purpose of the invention, as embodied and broadly described herein, the invention provides a method of manufacturing split-gate flash memory. A patterned hard mask layer is formed over a substrate. A shallow trench isolation structure is formed in the substrate. Then, using another patterned mask layer as an etching mask, a trench is formed in the substrate. A tunnel oxide layer is formed over the interior surface of the trench. Thereafter, a first conductive layer is formed inside the trench. Using an etching back process, the upper surface of the first conductive layer is below the upper surface of the substrate. The hard mask layer and the exposed portion of the tunnel oxide not being covered by the first conductive layer are sequentially removed. A gate dielectric layer is formed over the first conductive layer. After an etching back process, a portion of the gate dielectric layer still remains on the first conductive layer. A conformal first dielectric layer is formed over the substrate. A second conductive layer is formed over the substrate such that the trench is completely filled. A source/drain region is formed in the substrate on each side of the second conductive layer. The first conductive layer serves as a floating gate while the second conductive layer serves as a select gate.

In the process of forming the gate dielectric layer over the first conductive layer, a conformal second dielectric layer is formed on the interior surface of the trench followed by forming a photoresist layer inside the trench. By an etching back process, the photoresist layer then partially fills the trench and exposes a large portion of the second dielectric layer. Thereafter, the exposed portion of the second dielectric layer is removed to form the gate dielectric layer on the upper surface of the first conductive layer. Hence, the gate dielectric layer is formed between the select gate and the floating gate, and at each side of the select gate by a small portion. Since the floating gate and the select gate are fabricated within a substrate trench, overall dimension of each memory cell is reduced and overall level of integration for the split-gate memory is increased.

This invention also provides a split-gate flash memory structure. The flash memory at least includes a substrate with a trench therein, a floating gate, a select gate and a source/drain region. The floating gate is formed inside the trench. The upper surface of the floating gate is below the substrate surface. The select gate is also formed inside the trench above the floating gate. The select gate protrudes beyond the substrate surface. The source/drain region is formed in the substrate on each side of the select gate. The source/drain region and the floating gate are separated from each other by a distance. A tunnel oxide layer separates the floating gate from the substrate and a gate dielectric layer separates the floating gate from the select gate. A dielectric layer separates the select gate from the substrate.

In this invention, the source/drain region and the floating gate are separated from each other by a distance. When a severe over-erase condition occurs so that a conductive channel is formed underneath the floating gate before any application of voltage to the control gate, the channel on the sidewall of the select gate remains shut. Hence, the source/drain regions remain non-conductive and erroneous data read-out is prevented. On the other hand, the operation current can only flow along the drain region through select gate channel, floating gate channel, and reach the source region. Also and, due to the isolation effect from the isolation structure, the operation current cannot flow along side to cause the conduction between the source region and the drain region. In addition, since the split-gate structure is formed inside a substrate trench, dimension of each memory cell can be further reduced and overall level of integration can be increased.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 2:
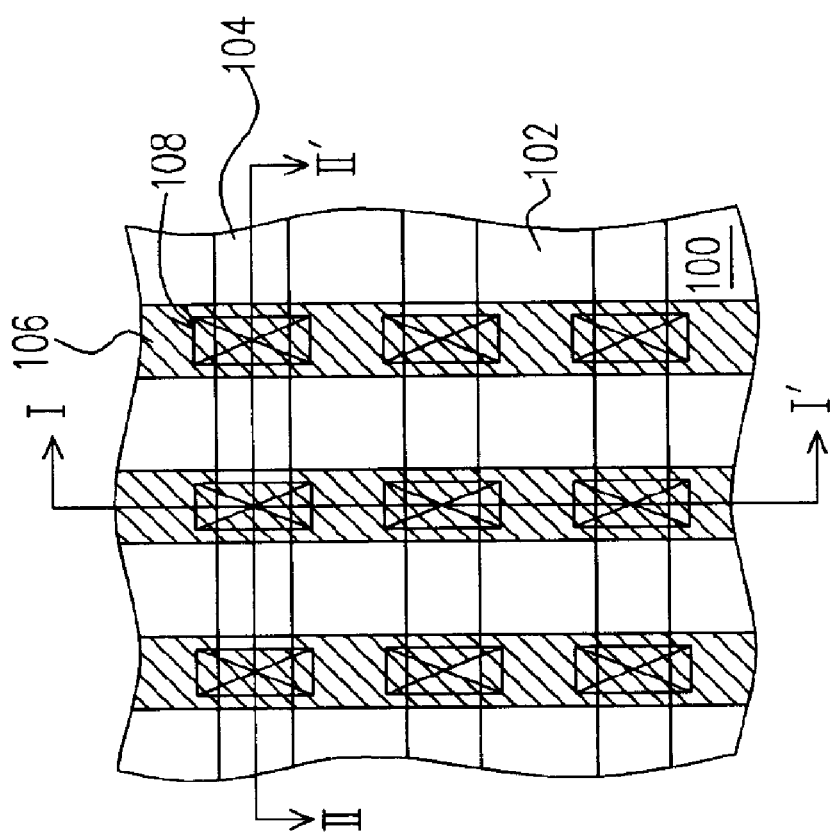
FIG. 2 is a top view, schematically illustrating a structure of the split-gate flash memory, according to the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1:
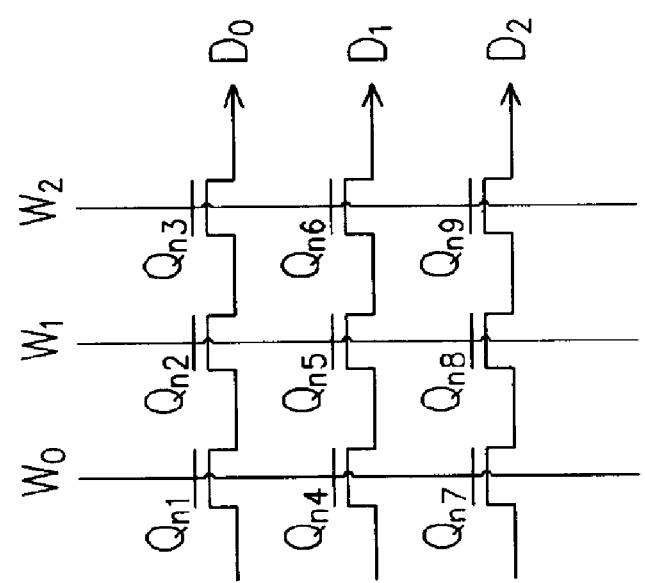
FIG. 1 is a drawing, schematically illustrating a circuit architecture for the split-gate flash memory, according to the present invention.

FIG. 1 is a drawing, schematically illustrating a circuit architecture for the split-gate flash memory, according to the present invention. A plurality of memory cells Qn1 to Qn9, data lines D0 to D2 and word lines W0 to W2 are shown in FIG. 2. The memory cells Qn1 to Qn3 are serially connected before coupling to the data line D0. Similarly, the memory cells Qn4 to Qn6 are serially connected before coupling to the data line D1 and the memory cells Qn7 to Qn9 are serially connected before coupling to the data line D2. The word line W0 is connected to the control gate of the memory cells Qn1, Qn4 and Qn7. Similarly, the word line W1 is connected to the control gate of the memory cells Qn2, Qn5 and Qn8 and the word line W2 is connected to the control gate of the memory cells Qn3, Qn6 and Qn9.

FIG. 2 is a top view of the split-gate flash memory according to this invention. As shown in FIG. 2, the split-gate flash memory comprises of a substrate 100, an isolation structure 102, an active region 104, a word line 106 and a memory cell 108. The isolation structure 102 is set up inside the substrate 100 for patterning out the active region 104. The word line 106 is set up above the substrate 100 perpendicular to the active region 104. The memory cell 108 is set up underneath the word line within the substrate 100 across the active region 104. In particular, the memory cell 108 is set up inside a trench within the substrate 100. Memory cells 108 within the same active region 104 are connected together before coupling to a data line (not shown).

Figure 3A:
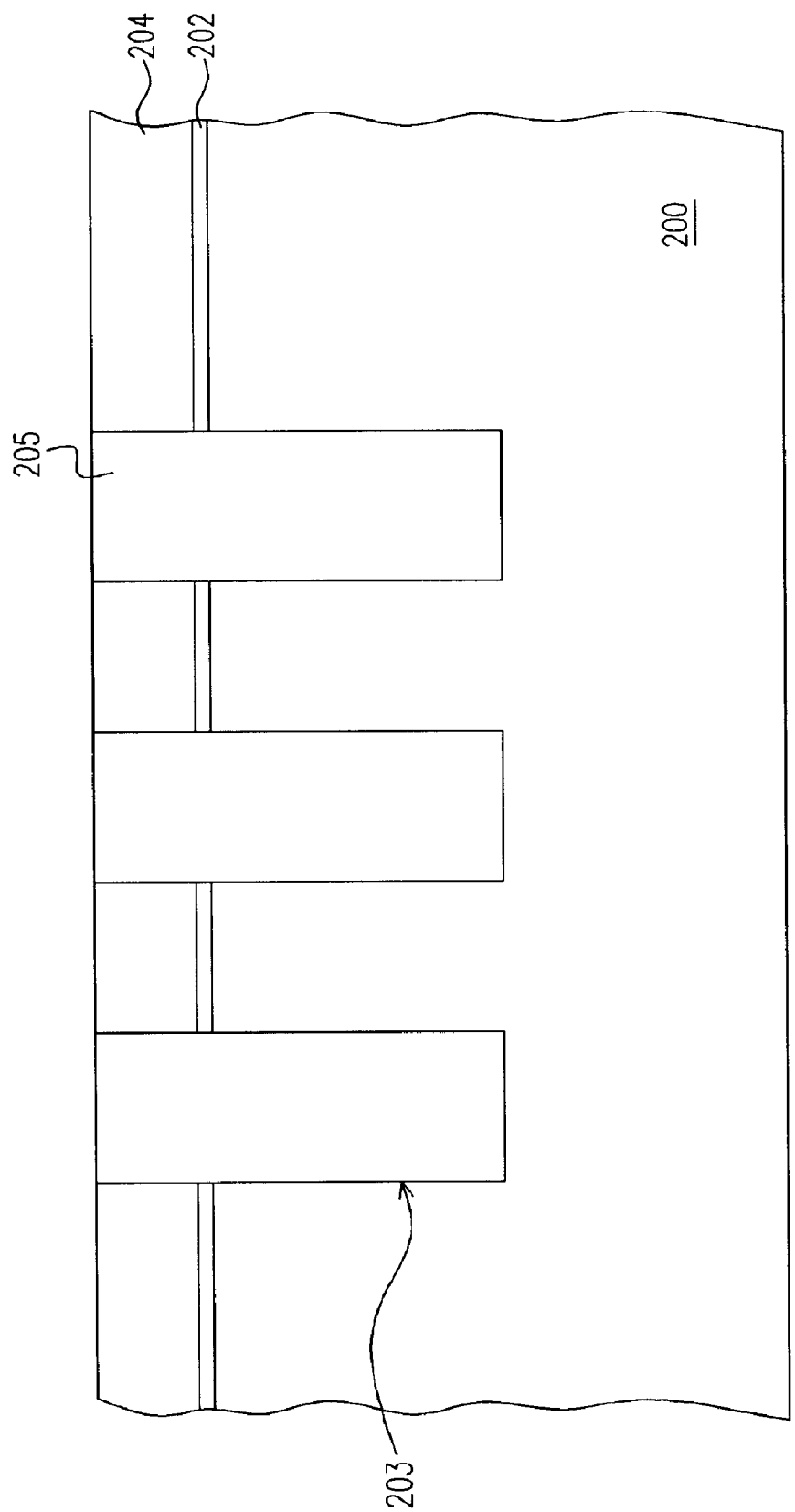
FIGS. 3A–3B are schematic cross-sectional views showing the progression of steps for forming split-gate flash memory along the line I–I' in FIG. 2, according to this invention.
Figure 3B:
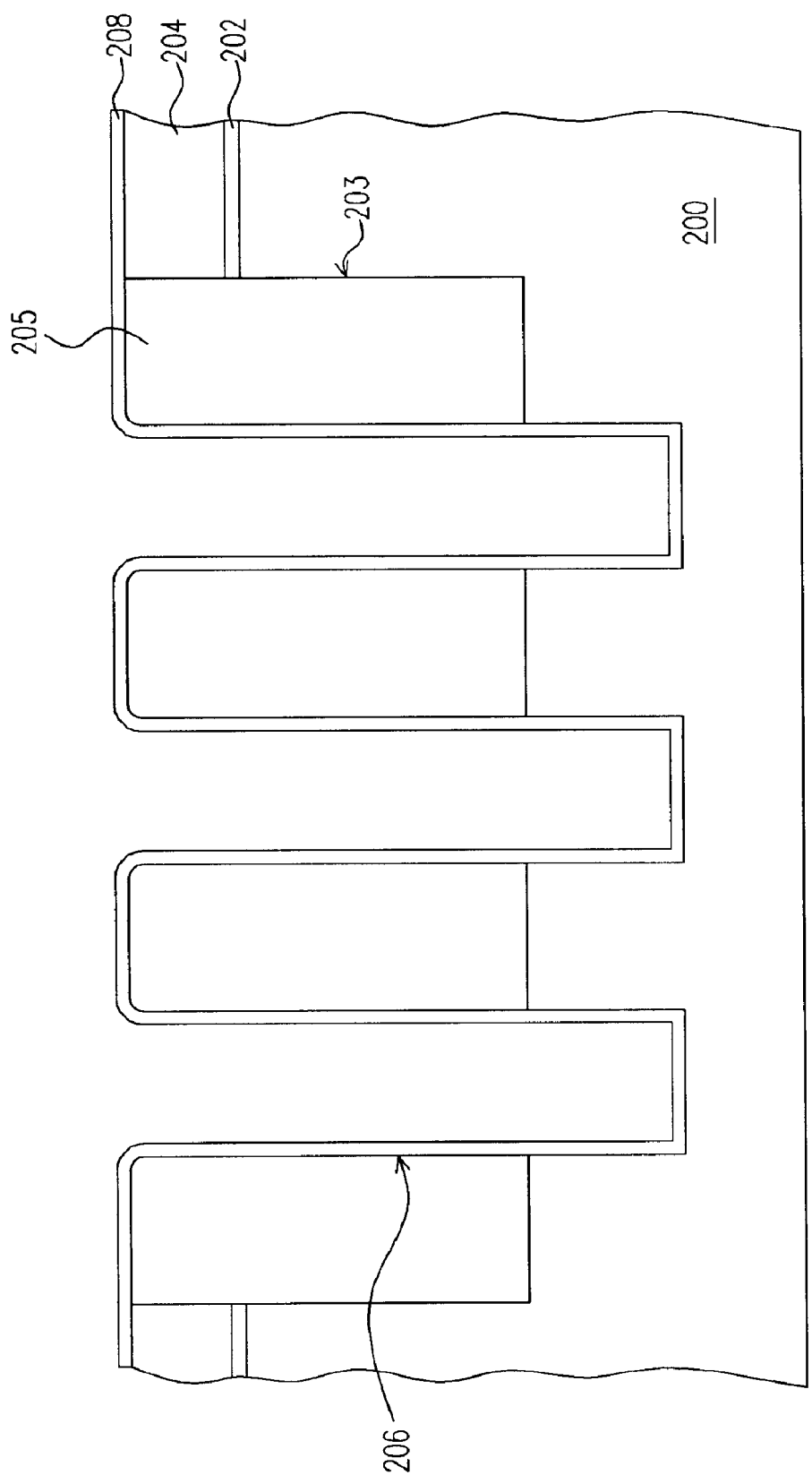

In the following, the process to fabricate the split-gate flash memory is described. FIGS. 3A–3B are schematic cross-sectional views showing the progression of steps for forming split-gate flash memory along the line I–I'; in FIG. 2, according to this invention. FIGS. 4A–4G are schematic cross-sectional views showing the progression of steps for forming split-gate flash memory along the line II–II' in FIG. 2, according to this invention. The same reference numerals indicate the same element.

Figure 4A:
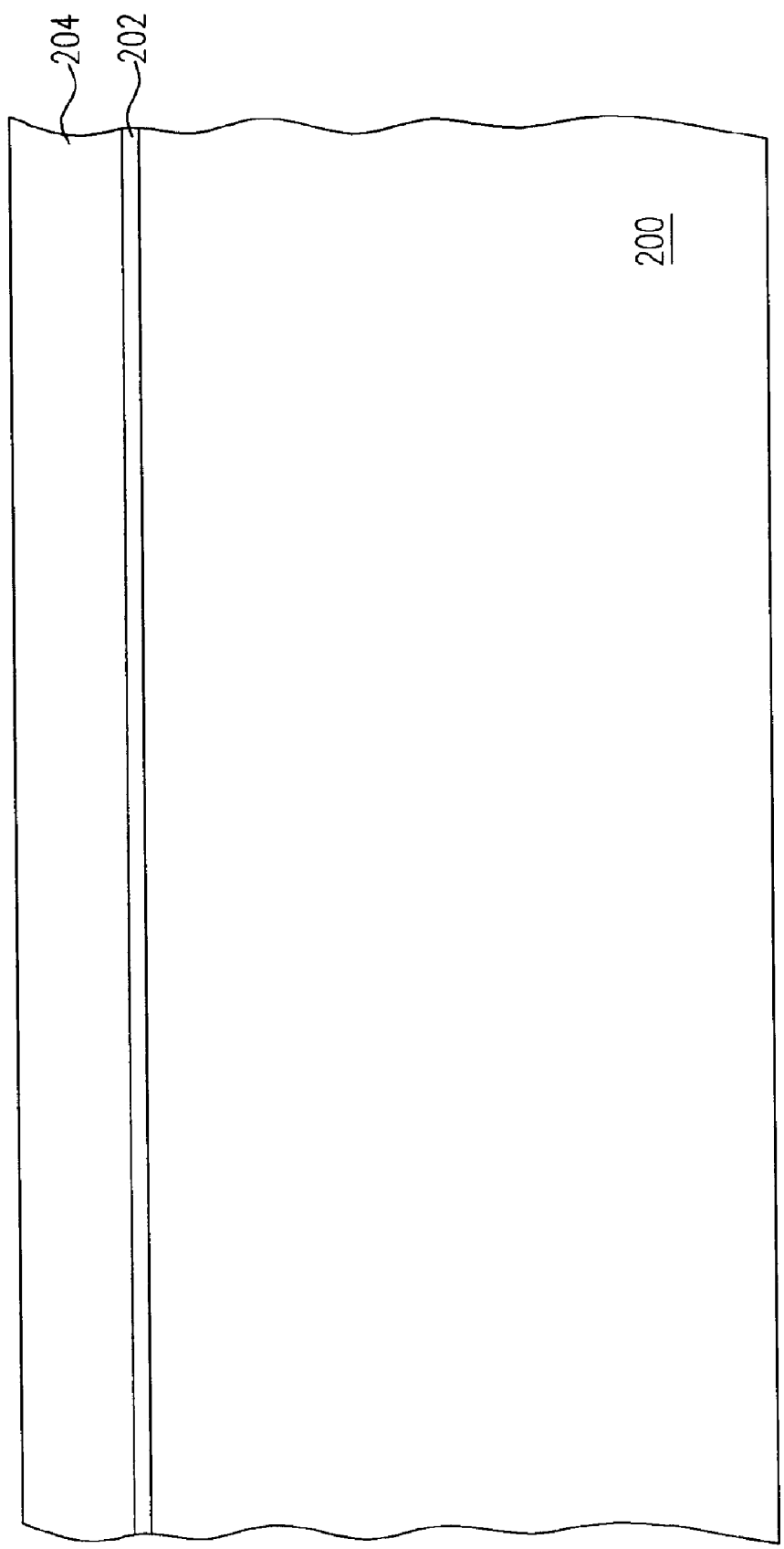
FIGS. 4A–4G are schematic cross-sectional views showing the progression of steps for forming split-gate flash memory along the line II–II' in FIG. 2, according to this invention.

Referring to FIG. 3A and FIG. 4A, a substrate 200 such as a semiconductor silicon substrate is provided. A pad oxide layer 202 and a mask layer 204 are sequentially formed over the substrate 200. The pad oxide layer 202 includes, for example, silicon oxide, and is formed by, for example, a thermal oxidation process. The mask layer 204 includes, for example, silicon nitride, and is formed by, for example, chemical vapor deposition (CVD). Then, a shallow trench isolation structure 205 is formed in the substrate 200. The shallow trench isolation structure 205 is, for example, a line layout. The method to form the shallow trench isolation structure 205 in the substrate 200 includes, for example, forming a photoresist layer (not shown) on the mask layer 204. Then the photolithographic and etching processes are performed to pattern the mask layer 204 and the pad oxide layer 202, so as to form an opening to expose the substrate. Then, using the mask layer 204 as a mask, an etching pr4ocess is performed, so as to form a number of trenches 203 in the substrate 200. The method to form the trenches 203 includes dry etching, such as a reaction ion etching process. An insulation layer is then formed over the substrate 200, wherein the trenches 203 are filled. A planarization process is performed over the substrate to expose the mask layer 204.

Figure 4B:
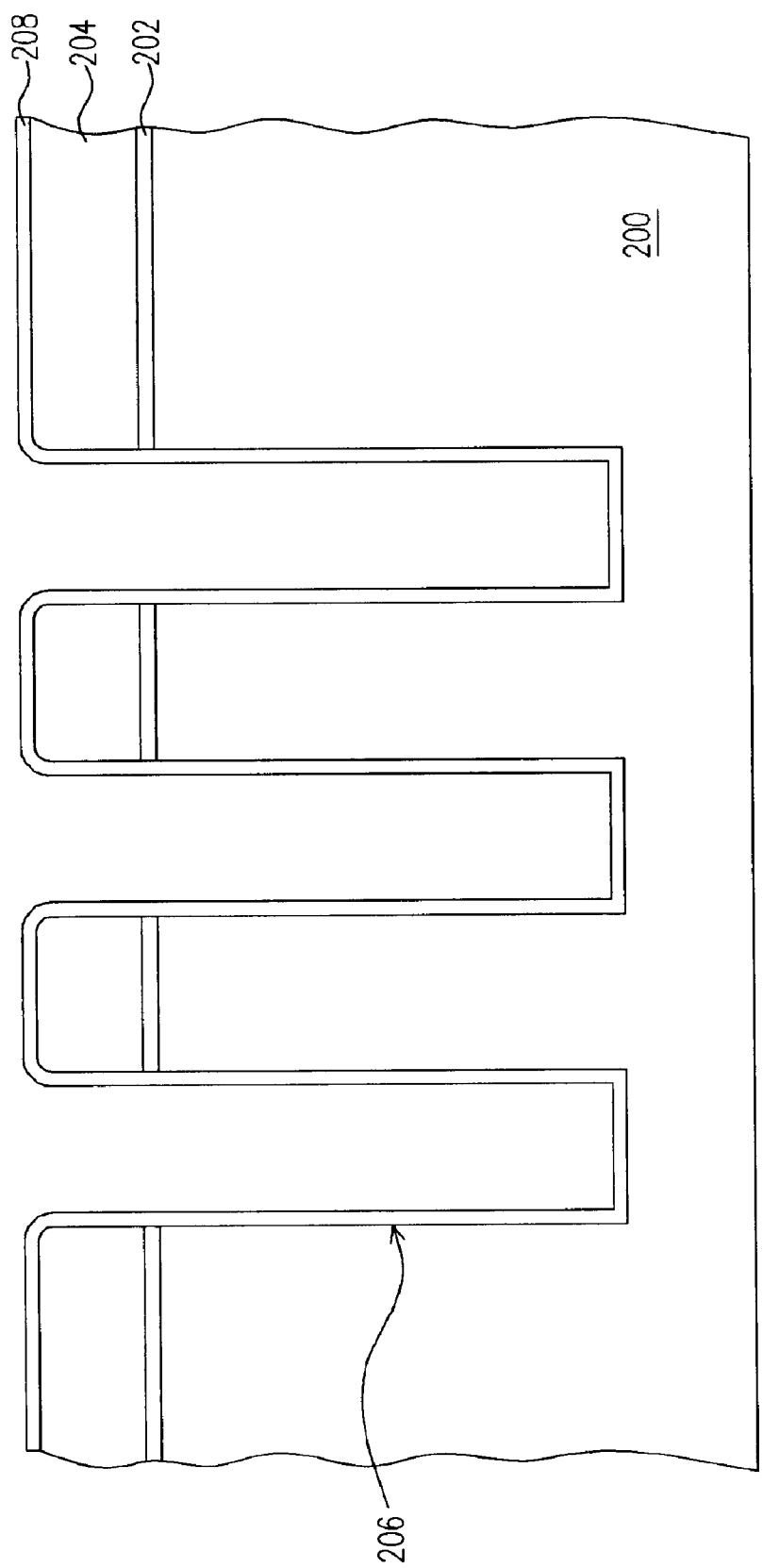

Referring to FIGS. 3B and 4B, another photoresist layer (not shown) is formed on the mask layer 204. By carrying out photolithographic and etching processes, the mask layer 204 and the pad oxide layer 202 are patterned to form an opening (not shown) that exposes a portion of the substrate 200. Using the mask layer 204 as an etching mask, the exposed substrate 200 is etched to form a plurality of trenches 206 in the substrate 200. The trenches 206 are formed, for example, by conducting a dry etching operation such as a reactive ion etching operation. As shown in FIG. 3B, the trenches 206 are located between the shallow trench isolation structures 205, and a bottom surface of the trench 206 is lower in height than the bottom of the shallow trench isolation structures 205.

A conformal dielectric layer 208 is formed over the substrate 200 covering the interior surface of the trenches 206 as well. The dielectric layer 208 can be a silicon oxide layer formed by thermal oxidation or low-pressure chemical vapor deposition, for example. In the following FIGS. 4C–4G are the fabrication process with respect to the structure along the line II–II' in FIG. 2.

Figure 4C:
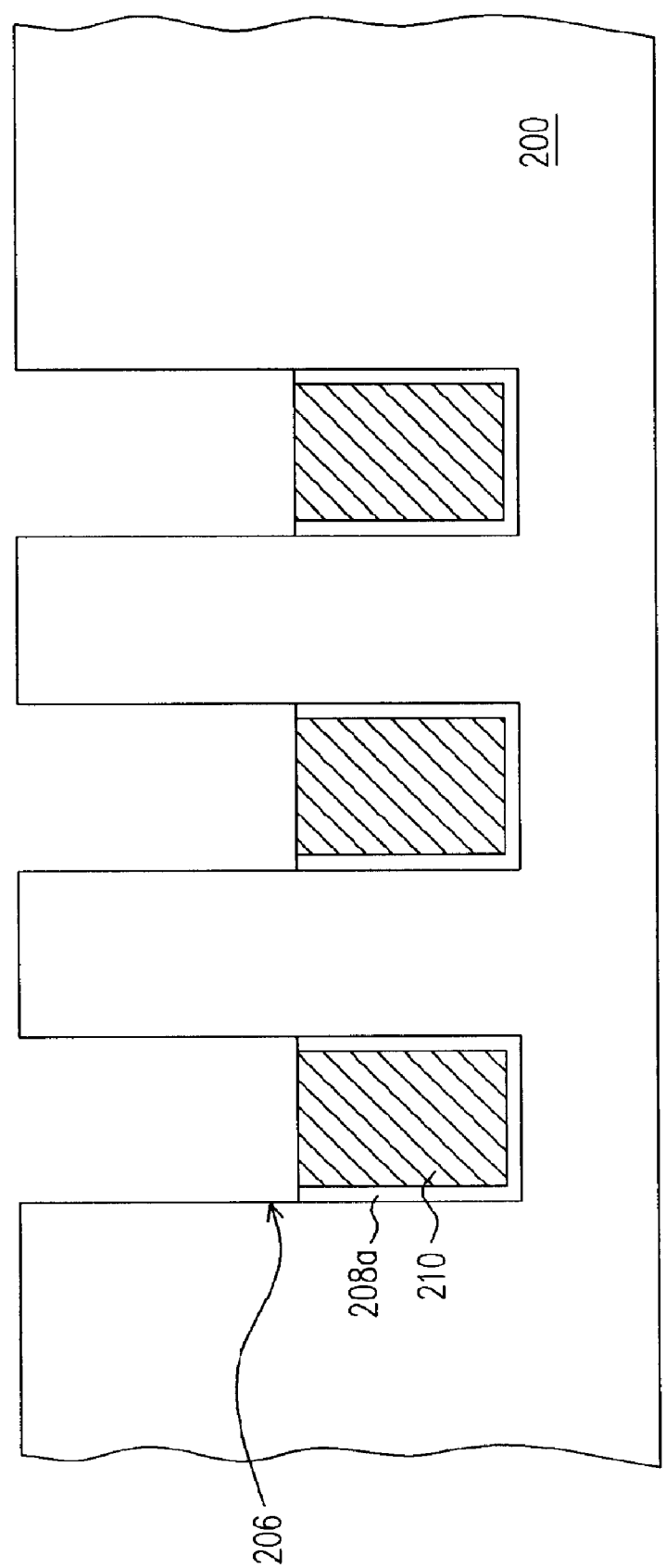

As shown in FIG. 4C, a conductive layer (not shown) is formed over the substrate 200. The conductive layer is a doped polysilicon layer formed, for example, by depositing an undoped polysilicon layer in a chemical vapor deposition. Then, impurity ions are implanted into the undoped polysilicon. Finally, the doped polysilicon layer is etched back to remove the portion of the conductive layer on the substrate 100 and a portion of the conductive layer inside the trench 206. Hence, only a portion of the conductive layer 210 remains inside the trench 206 so that the upper surface of the conductive layer 210 is below the upper surface of the substrate 200. The conductive layer 210 serves as a floating gate for the flash memory. Thereafter, the exposed dielectric layer 208 over the substrate 200 is removed to form a dielectric layer 208a. The dielectric layer 208a serves as a tunnel oxide layer of the split-gate flash memory.

Figure 4D:
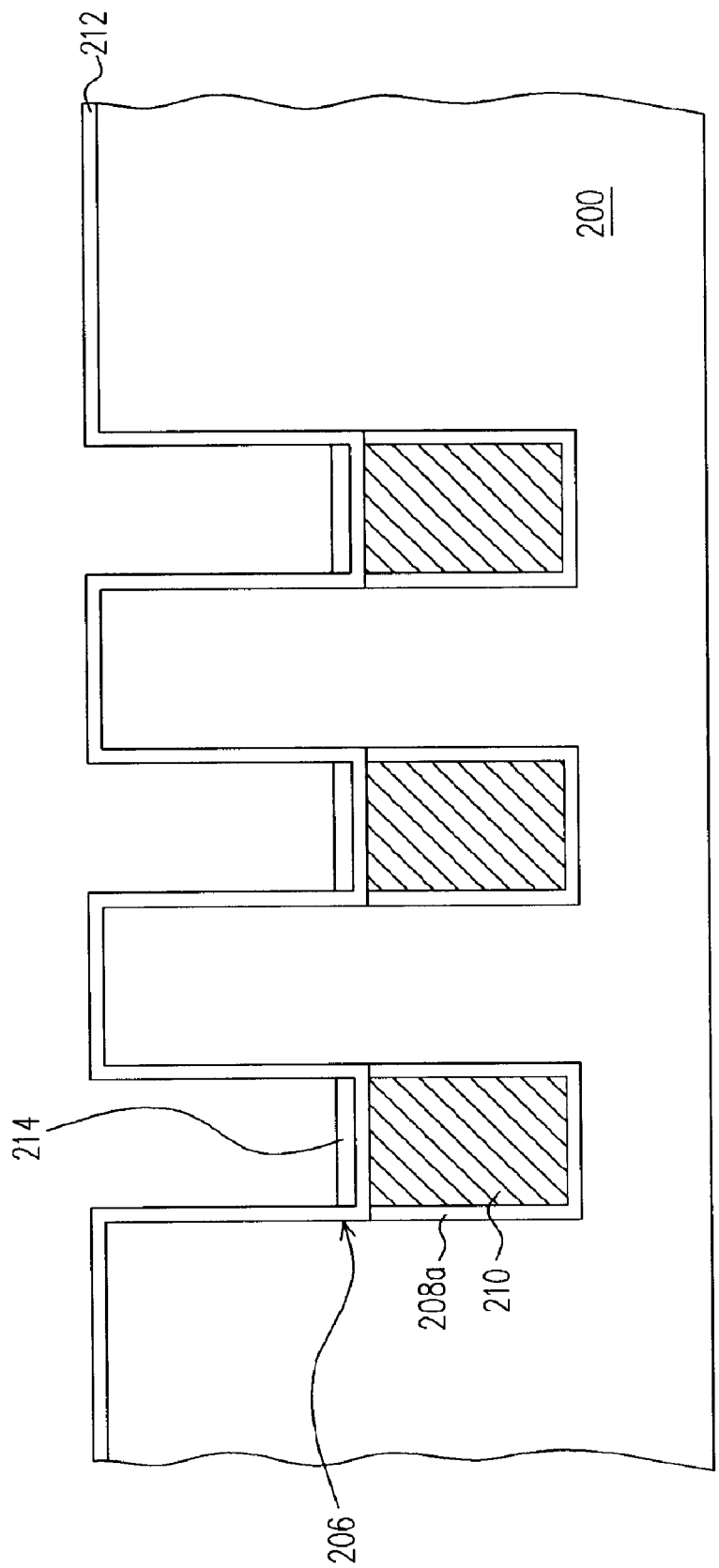

As shown in FIG. 4D, a conformal dielectric layer 212 is formed over the conductive layer 210 (the floating gate). The dielectric layer 212 is an oxide/nitride/oxide composite layer formed, for example, by a low-pressure chemical vapor deposition. Note that the dielectric layer 212 can also be a silicon oxide layer or an oxide/nitride composite layer as well. A photoresist layer 214 is formed inside the trench 206. The photoresist layer 214 only partially fills the trench 206 and the upper surface of the photoresist layer 214 is below the upper surface of the substrate 200. The photoresist layer 214 is formed, for example, by coating a photoresist layer (not shown) over the substrate 200 and etching to remove the photoresist layer above the substrate 200 surface and some inside the trench 206. The remaining photoresist layer 214 inside the trench 206 has a thickness between about 100 Å to 200 Å.

Figure 4E:
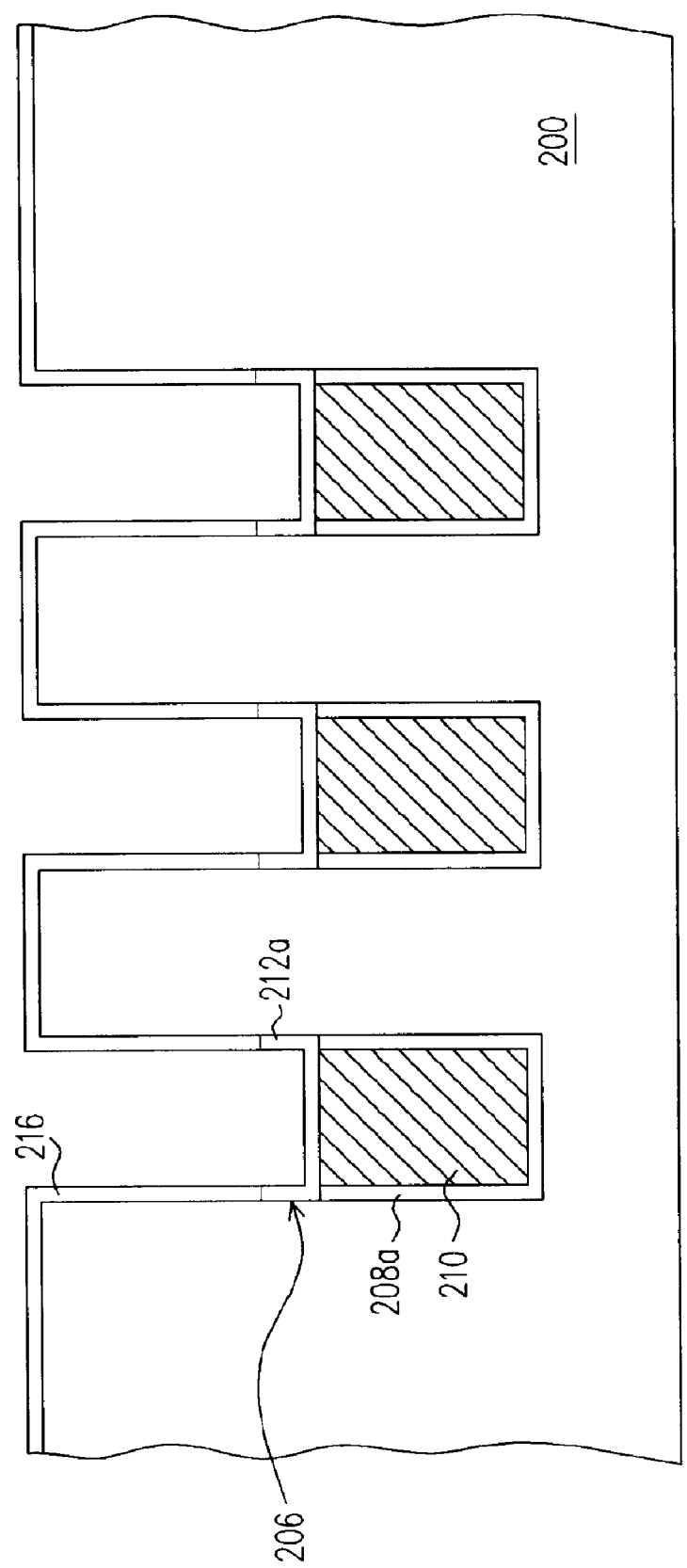

As shown in FIG. 4E, the exposed dielectric layer 212 is removed to form a dielectric layer 212a inside the trench 206. The dielectric layer 212a serves as a gate dielectric layer of the flash memory. The dielectric layer 112 is removed, for example, by wet etching using hot phosphoric acid as an etchant. After removing the photoresist layer 214, a dielectric layer 216 is formed over the substrate 100 and the sidewalls of the trench 206. The dielectric layer 216 can be a silicon oxide layer formed, for example, by thermal oxidation or low-pressure chemical vapor deposition.

Figure 4F:
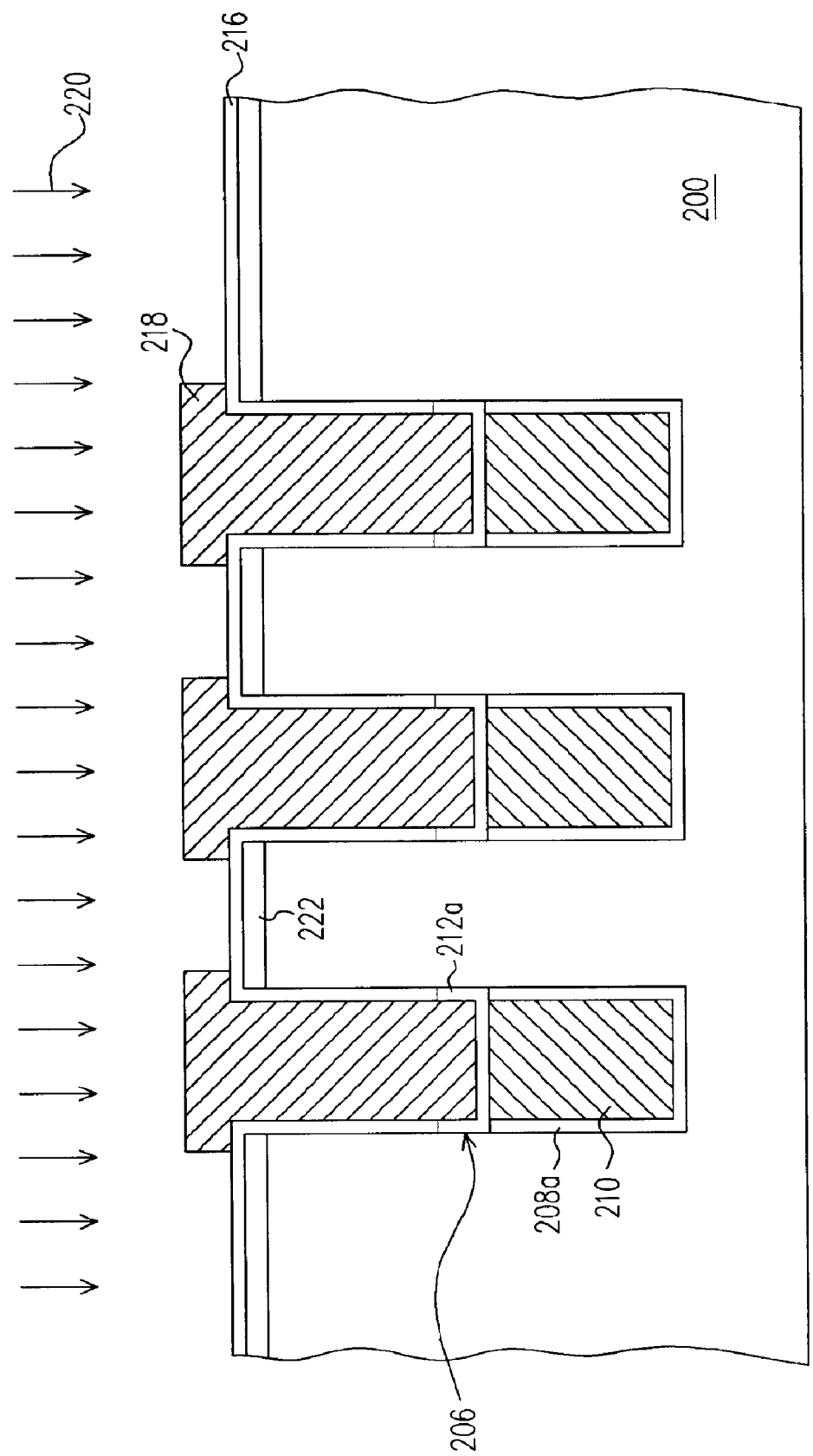

As shown in FIG. 4F, another conductive layer 218 is formed over the substrate 200 filling the trench 206. The conductive layer 218 can be a doped polysilicon layer for example. The conductive layer 218 serves as a control gate of the flash memory. The conductive layer 218 is formed, for example, by conducting an in-situ ion doping in a chemical vapor deposition to form a conductive layer (not shown) that completely fills the trench and patterning the conductive layer thereafter. An ion implantation 220 is conducted to form a lightly doped region 222 in the substrate 200 on each side of the conductive layer 218.

Figure 4G:
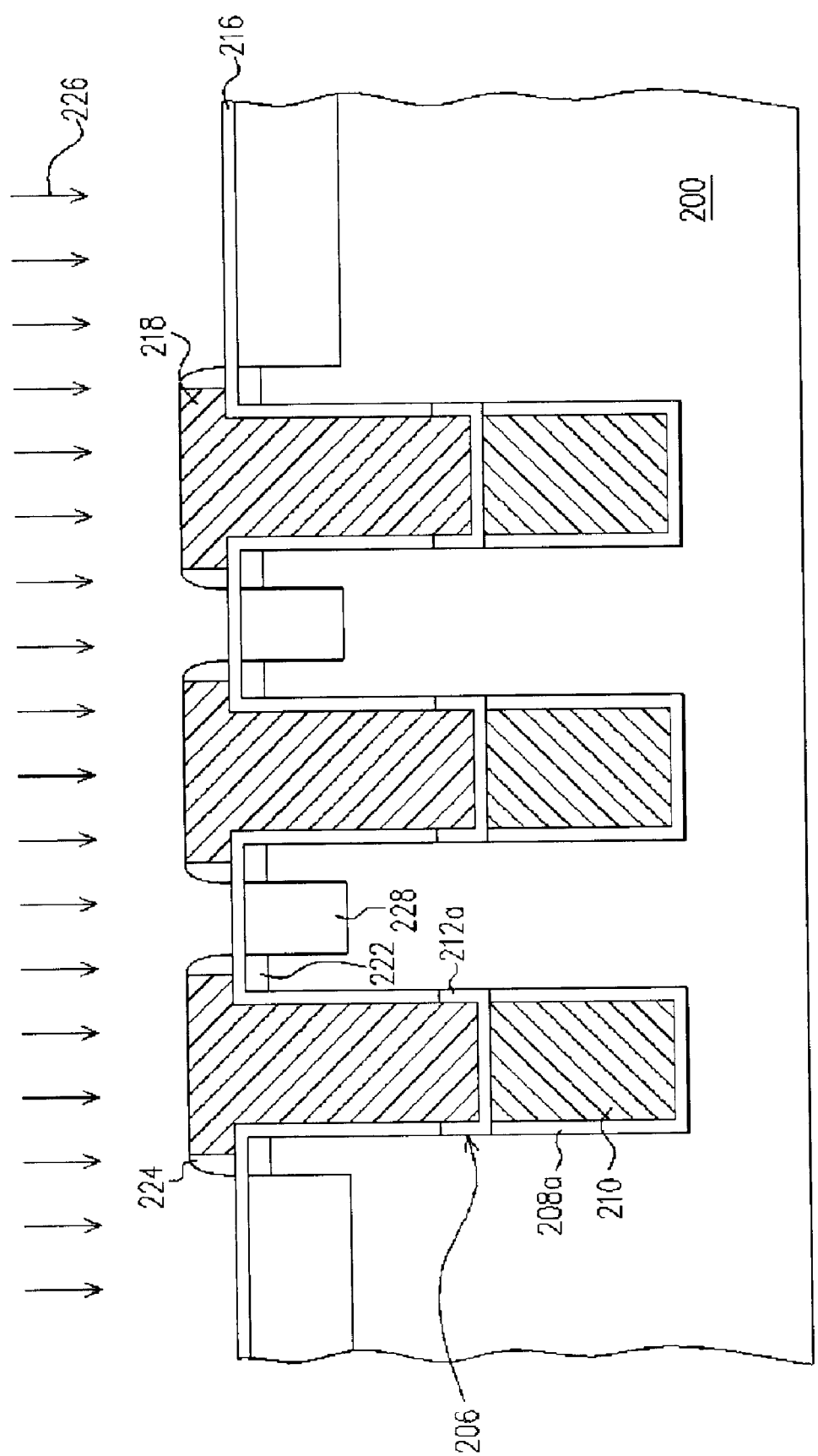

As shown in FIG. 4G, a spacer 224 is formed on the sidewalls of the conductive layer 218. The spacers 224 are formed, for example, by depositing insulating material to form an insulation layer (not shown) and removing a portion of the insulation layer in an anisotropic etching operation thereafter. The insulation layer can be a silicon oxide or a silicon nitride layer, for example. Thereafter, using the conductive layer 218 with the spacer 224 attached thereon as a mask, an ion implantation 226 is conducted to form a heavily doped region 228 in the substrate 200 on each side of the conductive layer 218. The lightly doped region 222 and the heavily doped region 228 together form a source/drain region of the flash memory. Since conventional methods are used in the remaining steps to form the flash memory, detailed descriptions are omitted.

Figure 5:
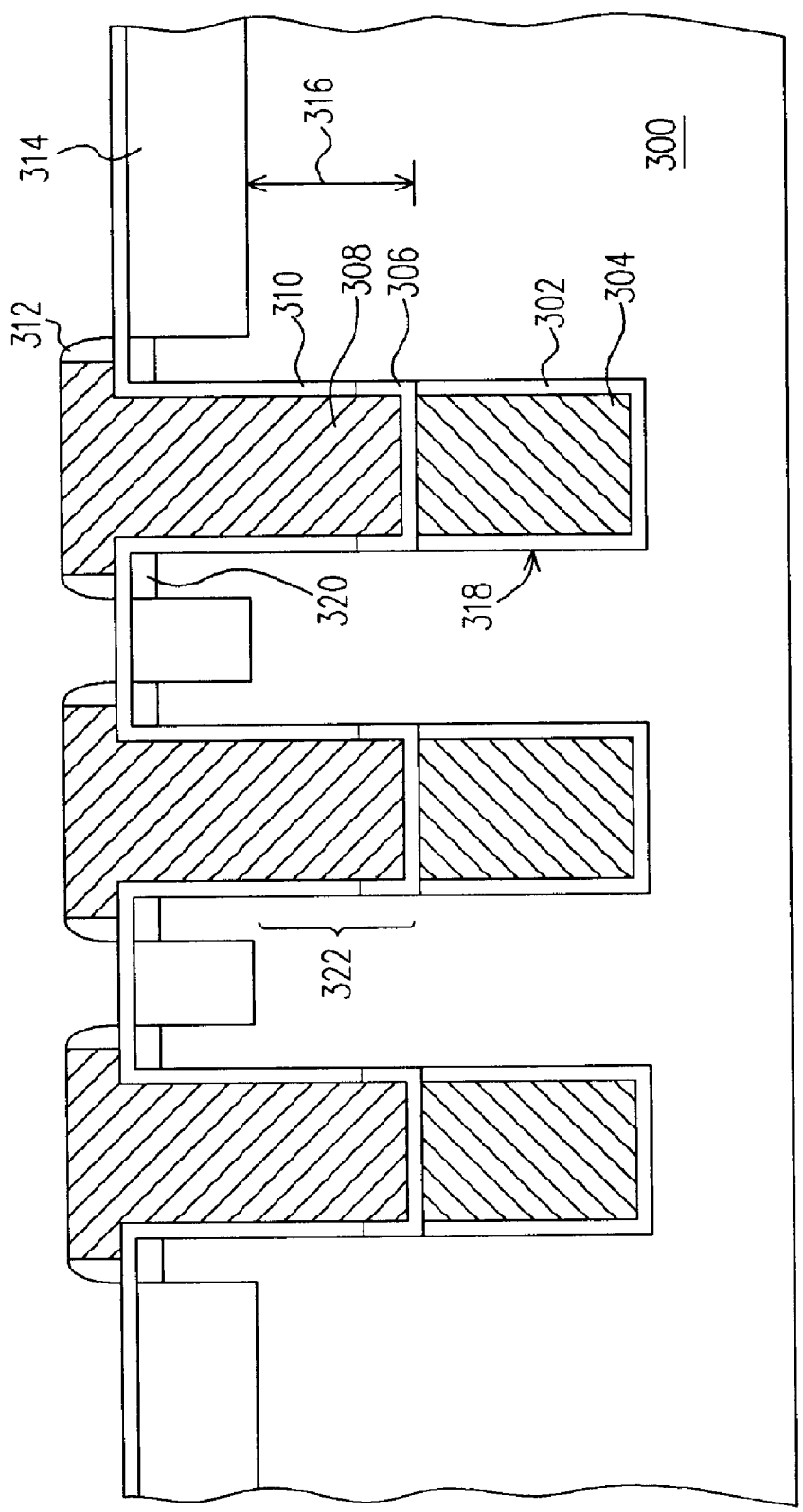
FIG. 5 is a cross-secinoal view of the split-gate flash memory according to this invention.

The split-gate flash memory in FIG. 5 has a substrate 300, a tunnel oxide layer 302, a floating gate 304, a gate dielectric layer 306, a select gate 308, a dielectric layer 310, a spacer 312 and a source/drain region 314. The floating gate 304 is set up inside a trench 318 within the substrate 300. The floating gate 304 has an upper surface below the upper surface of the substrate 300. The tunnel oxide layer 302 is set up between the floating gate 304 and the substrate 300. The select gate 308 is set up inside the floating gate within the trench 318. The select gate 308 has an upper surface that protrudes beyond the upper surface of the substrate 300. The gate dielectric layer 306 is set up between the floating gate 304 and the select gate 308. The dielectric layer 310 is set up between the select gate 308 and the substrate 300. The spacer 312 is attached to the sidewalls of the portion of select gate 308 that protrudes beyond the substrate 300 surface. The source/drain region 314 is set up in the substrate 300 on each side of the select gate 308. Furthermore, the source/drain region 314 and the floating gate 304 are separated from each other by a distance 316. A lightly doped region 320 is set up between the source/drain region 314 and the select gate 308.

When the split-gate flash memory carries out a data write/erase operation, a voltage is applied to the select gate 308. The gate voltage controls the injection of electrons through the tunnel oxide layer 302 into the floating gate or the pulling of electrons out of the floating gate 304 through the tunnel oxide layer 302.

In this invention, the source/drain region 314 and the floating gate 304 are separated from each other by the distance 316. When severe over-erase condition occurs, so that a conductive channel is formed underneath the floating gate before any application of voltage to the control gate, a channel 322 on the sidewall of the select gate 308 remains shut. Hence, the source/drain region 314 remains nonconductive and erroneous data read-out is prevented. In addition, since the split-gate structure is formed inside a substrate trench, dimension of each memory cell can be further reduced and overall level of integration can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a split-gate flash memory, comprising the steps of:
   providing a substrate;
   forming a patterned mask layer over the substrate;
   forming a trench in the substrate using the patterned mask layer as an etching mask;
   forming a tunnel oxide layer over the interior surface of the trench;
   forming a first conductive layer inside the trench, wherein the upper surface of the first conductive layer is lower than the upper surface of the substrate;
   removing the mask layer;
   removing the exposed tunnel oxide layer;
   forming a gate dielectric layer over the first conductive layer;
   forming a conformal first dielectric layer over the substrate;
   forming a second conductive layer over the substrate, wherein the second conductive layer completely fills the trench; and
   forming a source/drain region in the substrate on each side of the second conductive layer.

2. The method of claim 1, wherein the step of forming the gate dielectric layer over the first conductive layer further includes the sub-steps of:

forming a conformal second dielectric layer inside the trench;

forming a photoresist layer inside the trench, wherein the photoresist layer only partially fills the trench so that a portion of the second dielectric layer is exposed; and removing the exposed second dielectric layer, which is not covered by the photoresist layer, to form the gate dielectric layer over the first conductive layer.

3. The method of claim 2, wherein the gate dielectric layer includes an oxide/nitride/oxide composite layer.

4. The method of claim 2, wherein the step of removing the exposed second dielectric layer includes wet etching.

5. The method of claim 4, wherein the wet etching is conducted by using hot phosphoric acid as an etchant.

6. The method of claim 1, wherein the first conductive layer serves as a floating gate.

7. The method of claim 1, wherein the second conductive layer serves as a control gate.

8. The method of claim 1, wherein the fabricating step further includes forming a pad oxide layer between the patterned mask layer and the substrate.

9. The method of claim 1, before the step of forming the trench in the substrate using the patterned mask layer as the etching mask, further comprising forming a shallow trench isolation structure in the substrate.

* * * * *